(12) United States Patent
Sung et al.

(10) Patent No.: US 11,120,738 B2
(45) Date of Patent: Sep. 14, 2021

(54) DISPLAY APPARATUS

(71) Applicant: SAMSUNG DISPLAY CO., LTD., Yongin-si (KR)

(72) Inventors: Seungwoo Sung, Yongin-si (KR); Nayun Kwak, Yongin-si (KR); Daesuk Kim, Yongin-si (KR); Sujin Lee, Yongin-si (KR); Jieun Lee, Yongin-si (KR); Chaehan Hyun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/830,899

(22) Filed: Mar. 26, 2020

(65) Prior Publication Data

US 2021/0110765 A1 Apr. 15, 2021

(30) Foreign Application Priority Data

Oct. 15, 2019 (KR) .................. 10-2019-0127867

(51) Int. Cl.
*G09G 3/3225* (2016.01)
*G09G 3/3275* (2016.01)

(52) U.S. Cl.
CPC ......... *G09G 3/3225* (2013.01); *G09G 3/3275* (2013.01); *G09G 2300/0426* (2013.01)

(58) Field of Classification Search
CPC ............... H01L 27/1218; H01L 27/124; H01L 27/3248; H01L 27/3276; H01L 27/3279; H01L 51/0097; H01L 2251/5338; Y02E 10/549

See application file for complete search history.

(56) References Cited

U.S. PATENT DOCUMENTS

| 10,096,274 | B2 | 10/2018 | Jung et al. | |
| 10,431,604 | B2 | 10/2019 | Cho et al. | |
| 10,748,942 | B2 * | 8/2020 | Kim | H01L 27/124 |
| 2007/0146354 | A1 | 6/2007 | Kubota et al. | |
| 2017/0287394 | A1 * | 10/2017 | Kim | G09G 3/3266 |
| 2018/0033354 | A1 * | 2/2018 | Lee | G09G 3/006 |
| 2019/0237487 | A1 | 8/2019 | Zhang et al. | |

FOREIGN PATENT DOCUMENTS

| CN | 108254984 | 7/2018 |
| KR | 10-0509257 | 8/2005 |
| KR | 10-0515281 | 9/2005 |
| KR | 10-2007-0065063 | 6/2007 |
| KR | 10-1815895 | 1/2018 |
| KR | 10-2018-0125061 | 11/2018 |
| KR | 10-2020-0017012 | 2/2020 |

* cited by examiner

*Primary Examiner* — Nelson M Rosario
(74) *Attorney, Agent, or Firm* — F. Chau & Associates, LLC

(57) ABSTRACT

A display apparatus includes a first data line extending from a first peripheral area into a display area, a second data line extending from a second peripheral area into the display area, a pixel electrode, a second input line disposed in the first peripheral area, and a connecting line having a first end electrically connected to the second data line in the second peripheral area and a second end electrically connected to the second input line in the first peripheral area. The connecting line passes through the display area by extending over the first data line while not contacting the first data line, and at least a portion of the connecting line and the pixel electrode include a same material.

24 Claims, 13 Drawing Sheets

DISPLAY APPARATUS

CROSS-REFERENCE TO RELATED APPLICATIONS

This application claims priority under 35 U.S.C. § 119 to Korean Patent Application No. 10-2019-0127867, filed on Oct. 15, 2019 in the Korean Intellectual Property Office, the disclosure of which is incorporated by reference herein in its entirety.

TECHNICAL FIELD

Exemplary embodiments relate to a display apparatus, and more particularly, to a display apparatus in which a non-display area may be reduced and which is capable of realizing a high quality image.

DISCUSSION OF THE RELATED ART

In general, a display apparatus, such as an organic light-emitting display (OLED) apparatus, includes a thin film transistor arranged in each of a plurality of pixels for controlling the brightness of each pixel. For example, the thin film transistors control the brightness of the corresponding pixels in response to transmitted data signals.

The data signals are transmitted to the pixels from a driving portion in a peripheral area outside a display area, through a plurality of data lines.

SUMMARY

Referring to a display apparatus according to a comparative example, a driving portion may occupy a large region of the display apparatus, or a region between the driving portion and a display area of the display apparatus may be large, which may cause the amount of dead space in which an image cannot be displayed on the display apparatus to become excessively large.

According to exemplary embodiments, a display apparatus for realizing a high quality image while reducing a non-display area (e.g., dead space) is provided.

According to an exemplary embodiment, a display apparatus includes a substrate including a display area, a first peripheral area disposed outside the display area, and a second peripheral area disposed outside the display area and the first peripheral area. The display apparatus further includes a first data line disposed on the substrate and extending from the first peripheral area into the display area, a second data line disposed on the substrate and extending from the second peripheral area into the display area, and a third data line disposed on the substrate and extending from the second peripheral area into the display area. The second data line is disposed between the first data line and the third data line. The display apparatus further includes a pixel electrode. The display apparatus further includes a first input line, a second input line, and a third input line disposed in the first peripheral area and spaced apart from one another, and a first connecting line (e.g., connecting line CL2 in FIGS. 3 and 4) having a first end and a second end. The first end is electrically connected to the second data line in the second peripheral area, and the second end is electrically connected to the second input line in the first peripheral area. The first connecting line passes through the display area by extending over the first data line while not contacting the first data line. At least a portion of the first connecting line and the pixel electrode include a same material.

In an exemplary embodiment, the portion of the first connecting line is a portion extending over the first data line.

In an exemplary embodiment, the portion of the first connecting line extending over the first data line has a same layer structure as the pixel electrode.

In an exemplary embodiment, the first connecting line includes a first portion having a first end connected to the second data line in the second peripheral area. The first portion is disposed on a same layer as the second data line and extends to the display area. The first connecting line further includes a second portion having a first end connected to a second end of the first portion. The second portion extends over the first data line while not contacting the first data line, and includes the same material as the pixel electrode. The first connecting line further includes a third portion having a first end connected to a second end of the second portion. A second end of the third portion is electrically connected to the second input line in the first peripheral area.

In an exemplary embodiment, the first end of the second portion is connected to the second end of the first portion through a contact hole formed in an insulating layer disposed between the first portion and the second portion.

In an exemplary embodiment, the contact hole is disposed in the display area.

In an exemplary embodiment, the first portion and the second data line are integrally formed as a single body.

In an exemplary embodiment, the second portion has a same layer structure as the pixel electrode.

In an exemplary embodiment, the third portion is disposed on a same layer as the second input line.

In an exemplary embodiment, the second end of the second portion is disposed over the first end of the third portion and connected to the first end of the third portion through a contact hole formed in an insulating layer disposed between the second portion and the third portion.

In an exemplary embodiment, the contact hole is disposed in the display area.

In an exemplary embodiment, the third portion and the second input line are integrally formed as a single body.

In an exemplary embodiment, the second input line is disposed on a same layer as the second data line.

In an exemplary embodiment, the display apparatus further includes a second connecting line (e.g., connecting line CL3 in FIGS. 3 and 4) having a first end and a second end. The first end is electrically connected to the third data line in the second peripheral area, and the second end is electrically connected to the third input line in the first peripheral area. The second connecting line passes through the display area by extending over the first and second data lines while not contacting the first and second data lines. At least a portion of the second connecting line and the pixel electrode include the same material.

In an exemplary embodiment, the portion of the second connecting line is a portion extending over the first and second data lines.

In an exemplary embodiment, the portion of the second connecting line extending over the first and second data lines has a same layer structure as the pixel electrode.

In an exemplary embodiment, the portion of the second connecting line extending over the first and second data lines is more adjacent to the first peripheral area than a portion of the first connecting line extending over the first data line.

In an exemplary embodiment, a length of the portion of the second connecting line including the same material as the pixel electrode is greater than a length of the portion of the first connecting line including the same material as the pixel electrode.

In an exemplary embodiment, the display apparatus further includes a thin film transistor disposed on the substrate in the display area and including a source electrode and a drain electrode. The first through third data lines are disposed on a same layer as the source electrode and the drain electrode.

In an exemplary embodiment, the display apparatus further includes a thin film transistor disposed on the substrate in the display area and including a source electrode and a drain electrode. The first through third data lines are disposed on an insulating layer covering the source electrode and the drain electrode.

According to an exemplary embodiment, a display apparatus includes a first data line extending from a first peripheral area into a display area, a second data line extending from a second peripheral area into the display area, a pixel electrode disposed on the first and second data lines, an input line disposed in the first peripheral area, and a connecting line having a first end and a second end. The first end is electrically connected to the second data line in the second peripheral area, and the second end is electrically connected to the input line in the first peripheral area. The connecting line passes through the display area by extending over the first data line while not contacting the first data line. At least a portion of the connecting line and the pixel electrode include a same material.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
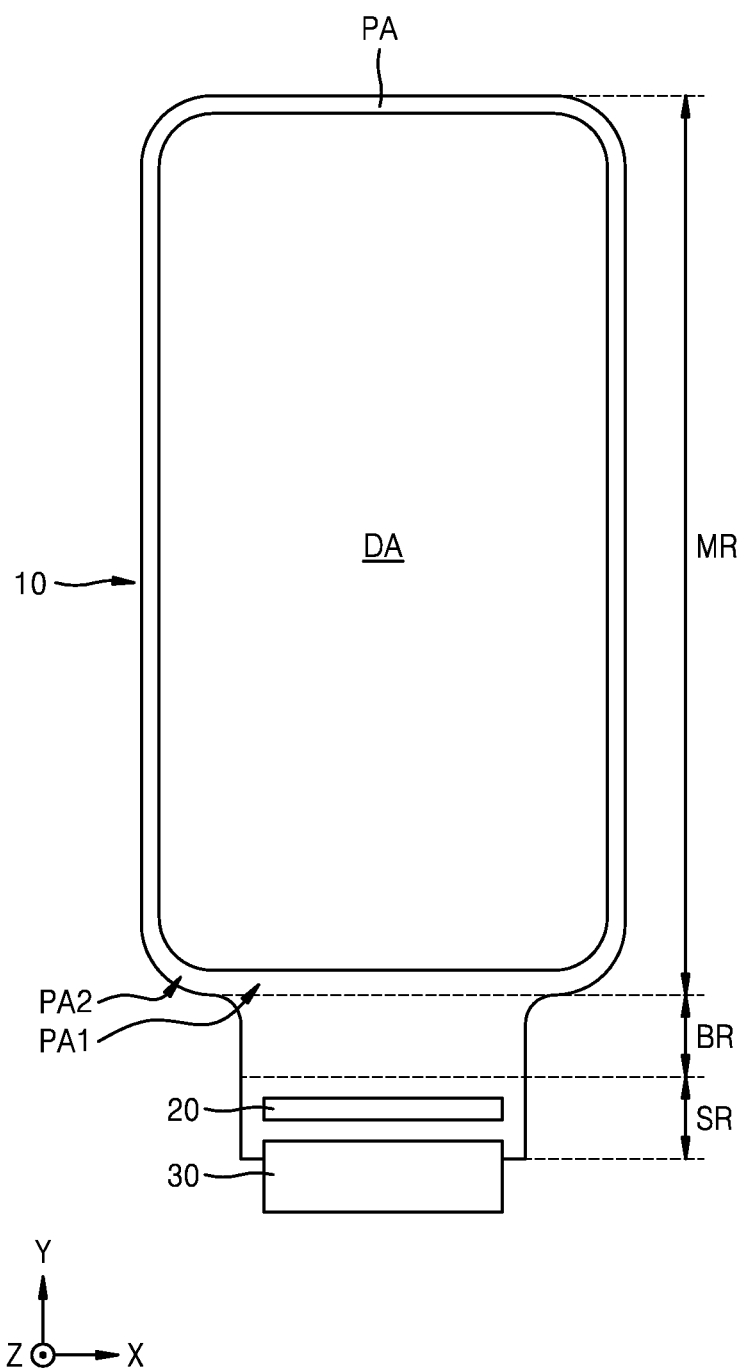
FIG. 1 is a schematic plan view of a portion of a display apparatus according to an exemplary embodiment.

Exemplary embodiments will be described more fully hereinafter with reference to the accompanying drawings. Like reference numerals may refer to like elements throughout the accompanying drawings.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

In the exemplary embodiments to be described hereinafter, an x-axis, a y-axis, and a z-axis are not limited to three axes on an orthogonal coordinate system, and may be interpreted as indicating a broader concept including the three axes on the orthogonal coordinate system. For example, the x-, y-, and z-axes may be orthogonal with respect to one another, or may be in different directions in which the x-, y-, and z-axes do not cross at right angles with respect to one another.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, when two or more processes are described as being performed at or occurring at substantially the same time, it is to be understood that the processes may be performed at or may occur at exactly the same time, or at about the same time as would be understood by a person having ordinary skill in the art. For example, the processes may be performed at or may occur at about the same time within a measurement error as would be understood by a person having ordinary skill in the art.

Figure 2:
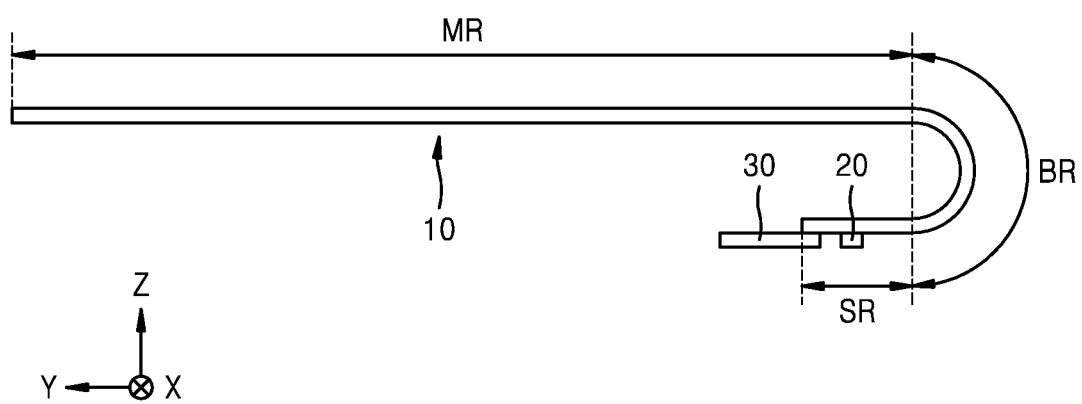
FIG. 2 is a schematic side view of the display apparatus of FIG. 1 according to an exemplary embodiment.

FIG. 1 is a plan view schematically illustrating a portion of a display apparatus according to an exemplary embodiment, and FIG. 2 is a side view schematically illustrating the display apparatus of FIG. 1 according to an exemplary embodiment. The display apparatus according to an exemplary embodiment may have a portion that is bent (e.g., a portion that is capable of being bent such). This portion may be referred to as a bendable portion. However, for convenience of illustration, it is illustrated in FIG. 1 that the bendable portion is not bent.

The display apparatus may include a display panel 10. The display apparatus may include any type of display apparatus that includes the display panel 10. For example, the display apparatus may include various products such as, for example, a smartphone, a tablet, a laptop, a television, or an advertising board.

The display panel 10 may include a display area DA and a peripheral area PA outside the display area DA. The peripheral area PA may include a first peripheral area PA1 at a side (in a −Y direction) outside the display area DA, and a second peripheral area PA2 also at a side (in the −Y direction) outside the display area DA and outside the first peripheral area PA1. The second peripheral area PA2 may be located at an external side (in a −X direction) of the first peripheral area PA1, and does not overlap the first peripheral area PA1. For example, based on the first peripheral area PA1, the second peripheral area PA2 may be located in a direction toward an edge of the display panel 10 (the −X direction) rather than a direction toward the center of the display panel 10. For example, the second peripheral area PA2 may be located closer to an edge of the display panel 10 compared to the first peripheral area PA1. In an exemplary embodiment, the first peripheral area PA1 is located outside the display area DA in a direction toward the center of the display panel 10, and the second peripheral area PA2 may be located outside the display area DA on both sides of the first peripheral area PA1 adjacent to opposing edges of the display panel 10 (and thus, closer to the opposing edges of the display panel 10 than the first peripheral area PA1).

Because the display panel 10 includes a substrate 100 (see FIG. 5), it may also be described that the substrate 100 includes the display area DA, the first peripheral area PA1, and the second peripheral area PA2 described above. Hereinafter, it will be described for convenience of explanation that the substrate 100 includes the display area DA, the first peripheral area PA1, and the second peripheral area PA2.

It may also be described that the display panel 10 includes a main region MR, a bending region BR outside the main region MR, and a sub-region SR located opposite the main region MR with the bending region BR therebetween. The display panel 10 may be bent in the bending region BR, as illustrated in FIG. 2. Thus, when viewed from a Z-axis direction, at least a portion of the sub-region SR may overlap the main region MR, as illustrated in FIG. 2. However, the disclosure is not limited to a display apparatus that is bent/bendable, and may also be applied to a display apparatus that is not bent/bendable. The sub-region SR may include a non-display area as described below. Because the display panel 10 is bent in the bending region BR, the non-display area of the display apparatus may not be visible to a user when the display apparatus is viewed from a front surface toward a −Z direction, or, even when the non-display area of the display apparatus is visible to a user, an area of the visible non-display area may be reduced.

A driving chip 20 may be arranged in the sub-region SR of the display panel 10. The driving chip 20 may include an integrated circuit for driving the display panel 10. The integrated circuit may include, for example, a data driving integrated circuit for generating a data signal. However, the present disclosure is not limited thereto.

The driving chip 20 may be mounted in the sub-region SR of the display panel 10. The driving chip 20 may be mounted on a plane that is the same as a plane of a display surface of the display area DA. However, the plane on which the driving chip 20 is mounted may change relative to the plane of the display surface of the display area DA when the bending region BR is bent. For example, as the display panel 10 is bent in the bending region BR as described above, the driving chip 20 may be located on a rear surface of the main region MR.

A printed circuit board 30 may be coupled to an end of the sub-region SR of the display panel 10. The printed circuit board 30 may be electrically connected to the driving chip 20 through a pad of a substrate 100.

The display panel 10 may include a substrate 100. The substrate 100 may include, for example, glass, metal, or polymer resins. As described above, the display panel 10 may be bent/bendable in the bending region BR. In this case, the substrate 100 may be flexible or bendable. For example, in this case, the substrate 100 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, the present disclosure is not limited thereto, and various modifications may be made. For example, the substrate 100 may have a multi-layered structure including two layers including the polymer resins described above and a barrier layer disposed between the two layers, the barrier layer including an inorganic material (e.g., silicon oxide, silicon nitride, silicon oxynitride, etc.).

Figure 3:
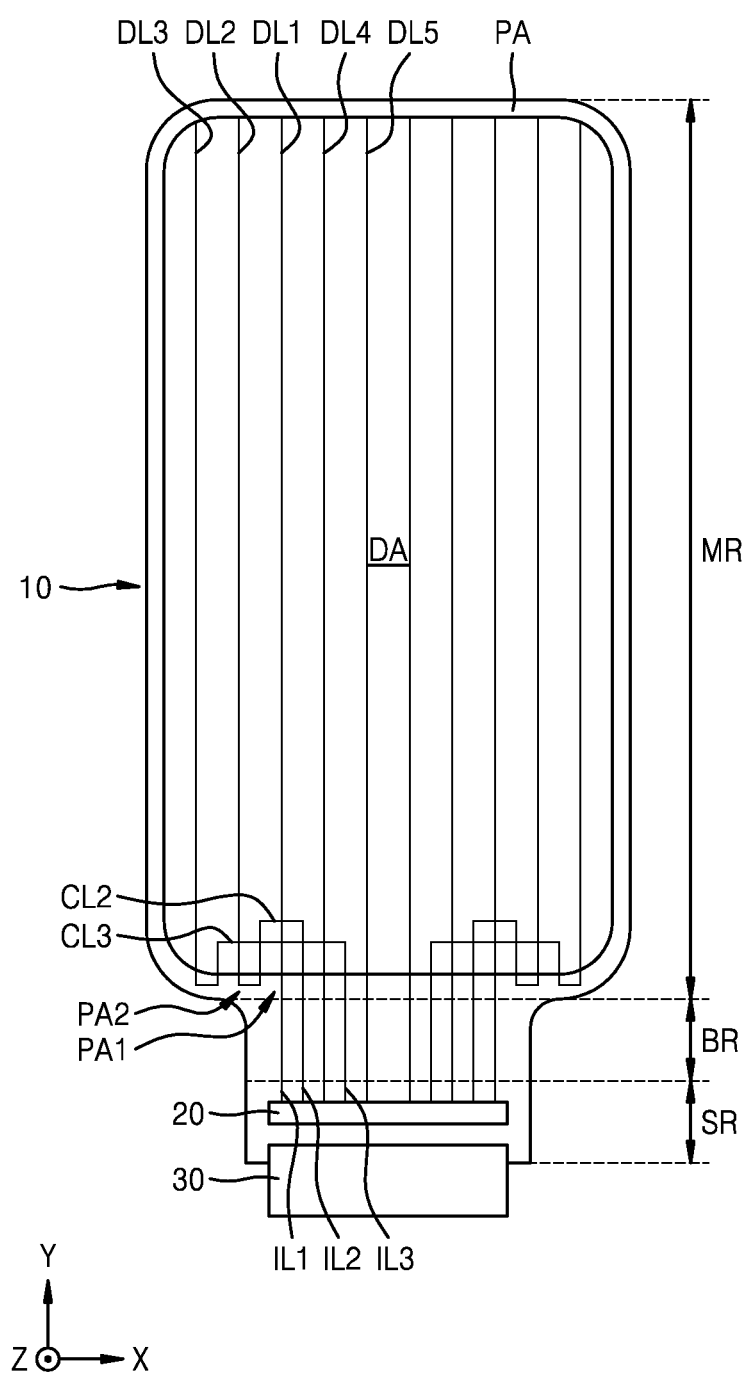
FIG. 3 is a schematic conceptual view of data lines, connecting lines, and input lines of the display apparatus of FIG. 1 according to an exemplary embodiment.
Figure 4:
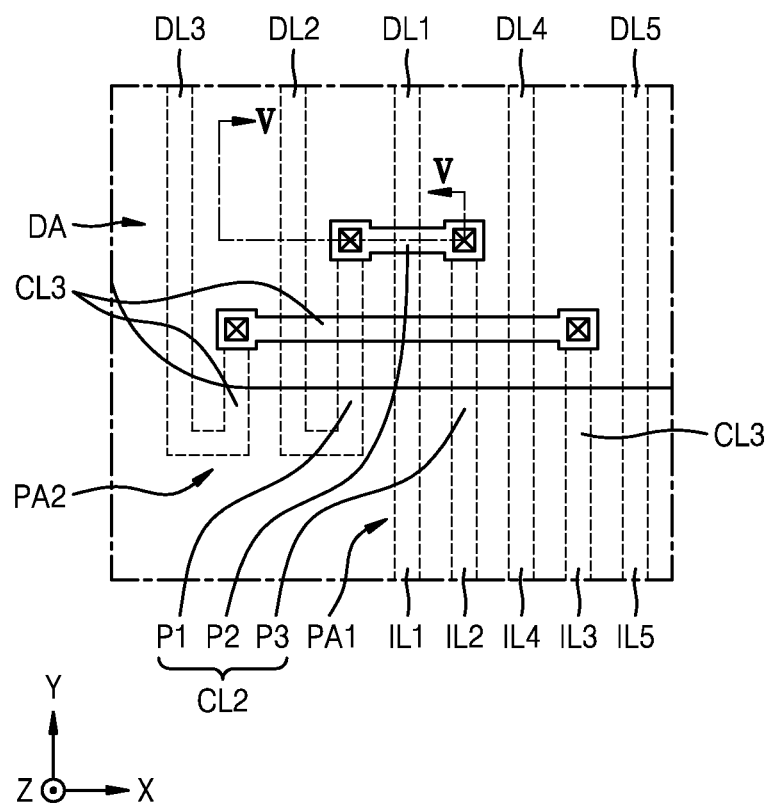
FIG. 4 is a schematic enlarged plan view of a region of FIG. 3 according to an exemplary embodiment.
Figure 5:
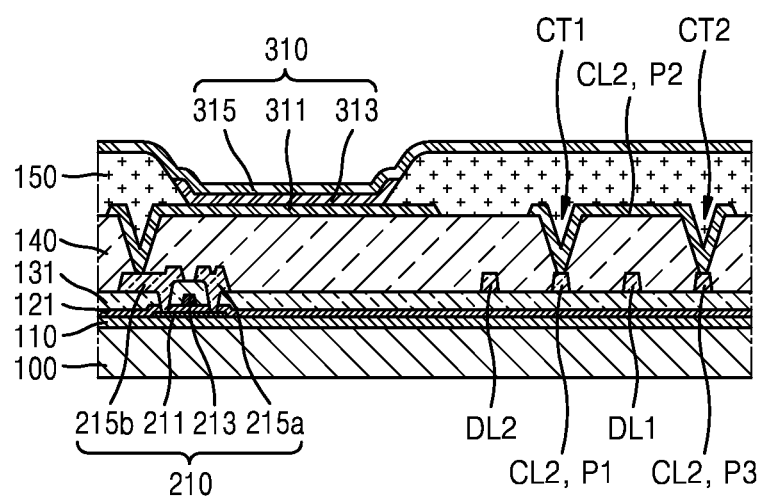
FIG. 5 is a cross-sectional view of a portion of the region taken along line V-V of FIG. 4 according to an exemplary embodiment.

FIG. 3 is a conceptual view schematically illustrating data lines, connecting lines, and input lines of the display apparatus of FIG. 1 according to an exemplary embodiment, FIG. 4 is an enlarged plan view schematically illustrating a region of FIG. 3 according to an exemplary embodiment, and FIG. 5 is a cross-sectional view of a portion of the region taken along line V-V of FIG. 4 according to an exemplary embodiment.

Various signals may be applied to the display area DA. For example, a data signal for adjusting a brightness of each pixel may be applied to the display area DA. To this end, various lines such as, for example, data lines DL1 through DL5 extending substantially parallel to one another, may be located on the substrate 100 inside and outside the display area DA, as schematically illustrated in FIG. 3. It is to be understood that additional signal lines such as, for example, power lines or scan lines, may also be located inside and outside the display area DA in addition to the data lines DL1 through DL5.

The first data line DL1 may extend from the first peripheral area PA1 into the display area DA. Thus, in an exemplary embodiment, the first data line DL1 is disposed in the first peripheral area PA1 and in the display area DA, and is not disposed in the second peripheral area PA2. The second data line DL2 may extend from the second peripheral area PA2 into the display area DA. Thus, in an exemplary embodiment, the second data line DL2 may be disposed in the second peripheral area PA2 and in the display area DA, and is not disposed in the first peripheral area PA1. The third data line DL3 may also extend from the second peripheral area PA2 into the display area DA. Thus, in an exemplary embodiment, the third data line DL3 may be disposed in the second peripheral area PA2 and in the display area DA, and is not disposed in the first peripheral area PA1. The third data line DL3 may be located opposite the first data line DL1 with the second data line DL2 disposed therebetween.

To input data signals to the data lines DL1 through DL5, input lines disposed apart from one another may be located in the first peripheral area PA1. For example, a first input line IL1 may be electrically connected to the first data line DL1, a second input line IL2 may be electrically connected to the second data line DL2, and a third input line IL3 may be electrically connected to the third data line DL3. The first input line IL1 may be integral with the first data line DL1 as illustrated in FIGS. 3 and 4. For example, the first input line IL1 and the first data line DL1 may be integrally formed as a single body. However, the present disclosure is not limited thereto. The second input line IL2 may be electrically connected to the second data line DL2 via a second connecting line CL2, and the third input line IL3 may be electrically connected to the third data line DL3 via a third connecting line CL3.

The second connecting line CL2 may have a first end electrically connected to the second data line DL2 in the second peripheral area PA2, and a second end electrically connected to the second input line IL2 in the first peripheral area PA1. The second connecting line CL2 may pass through the display area DA by extending over the first data line DL1 while not contacting the first data line DL1. Here, at least a portion of the second connecting line CL2 may include the same material as a material included in a pixel electrode 311 (see FIG. 5) to be described below. For example, in an exemplary embodiment, a portion of the second connecting line CL2 (e.g., the portion extending over the first data line DL1) may include the same material as a material included in the pixel electrode 311.

Further, the portion of the second connecting line CL2 (e.g., the portion extending over the first data line DL1) may have the same layer structure as the pixel electrode 311. Here, to have the same layer structure may denote that when the pixel electrode 311 has a transparent conductive layer including ITO, IZO, or $In_2O_3$, and a reflection conductive layer including Al, the portion of the second connecting line CL2 (e.g., the portion extending over the first data line DL1) may also have the transparent conductive layer including ITO, IZO, or $In_2O_3$, and the reflection conductive layer including Al. This may be because the portion of the second connecting line CL2 (e.g., the portion extending over the first data line DL1) may be simultaneously formed with the pixel electrode 311 by using the same material as the pixel electrode 311. For example, the portion of the second connecting line CL2 (e.g., the portion extending over the first data line DL1) and the pixel electrode 311 may be formed at substantially the same time using the same material. This aspect is the same in exemplary embodiments described below, and exemplary embodiments modified from the exemplary embodiments described below.

The second connecting line CL2 is described herein in detail. The second connecting line CL2 may include a first portion P1 through a third portion P3, as illustrated in FIG. 4.

A first end of the first portion P1 may be connected to the second data line DL2 in the second peripheral area PA2. Also, the first portion P1 may be located on the same layer (e.g., directly on the same layer) as the second data line DL2, and may extend to the display area DA. Accordingly, the first portion P1 may be connected to the second data line DL2 having a substantially linear shape. FIG. 4 illustrates that the first portion P1 is integral with the second data line DL2. For example, the first portion P1 and the second data line DL2 are integrally formed as a single body.

A first end of the second portion P2 may be connected to a second end of the first portion P1. For example, the first end of the second portion P2 may be connected to the second end of the first portion P1 through a first contact hole CT1 in an insulating layer (a planarization layer 140) between the first portion P1 and the second portion P2, as shown in FIG. 5. The first contact hole CT1 may be located in the display area DA. Also, the second portion P2 may extend over the first data line DL1 while not contacting the first data line DL1, and may include the same material as a material included in the pixel electrode 311. For example, the second portion P2 may have the same layer structure as the pixel electrode 311.

A first end of the third portion P3 may be connected to a second end of the second portion P2. The second end of the second portion P2 may be located above the first end of the third portion P3, and may be connected to the first end of the third portion P3 through a second contact hole CT2 in the insulating layer (the planarization layer 140) between the second portion P2 and the third portion P3. The second contact hole CT2 may be located in the display area DA. Also, a second end of the third portion P3 may be electrically connected to the second input line IL2 in the first peripheral area PA1. FIG. 4 illustrates that the third portion P3 is located on the same layer (e.g., directly on the same layer) as the second input line IL2, and the third portion P3 and the second input line IL2 are integral with each other (e.g., the third portion P3 and the second input line IL2 are integrally formed as a single body).

The second input line IL2 may be located on the same layer (e.g., directly on the same layer) as the second data line DL2, as illustrated in FIGS. 3 and 4. However, the disclosure is not limited thereto. For example, in exemplary embodiments, the second input line IL2 and the second data line DL2 may be located on different layers from each other.

The third connecting line CL3 electrically connecting the third input line IL3 to the third data line DL3 may have the same and/or substantially the same shape as the second connecting line CL2. For example, an end of the third connecting line CL3 may be electrically connected to the third data line DL3 in the second peripheral area PA2. Also, the third connecting line CL3 may pass through the display area DA by extending over the first data line DL1 and the second data line DL2 while not contacting the first data line DL1 and the second data line DL2. Also, the other end of the third connecting line CL3 may be electrically connected to the third input line IL3 in the first peripheral area PA1. At least a portion of the third connecting line CL3 may include the same material as a material included in the pixel electrode 311. For example, a portion of the third connecting line CL3 (e.g., the portion extending over the first and second data lines DL1 and DL2) may include the same material as a material included in the pixel electrode 311. Further, the portion of the third connecting line CL3 (e.g., the portion extending over the first and second data lines DL1 and DL2) may have the same layer structure as the pixel electrode 311.

Although not indicated by reference numerals for convenience of illustration, the third connecting line CL3 may have portions respectively corresponding to the first through third portions P1 through P3 of the second connecting line CL2. The descriptions of the first through third portions P1 through P3 of the second connecting line CL2 may be applied to such corresponding portions of the third connecting line CL3.

As illustrated in FIGS. 3 and 4, in the case of the display apparatus according to an exemplary embodiment, an area of a dead space around an edge of the display area DA may be significantly reduced. The first data line DL1, located in a direction toward the center of the display panel 10 relative to the second data line DL2 or the third data line DL3, may be directly connected to the first input line IL1 (e.g., connected to the first input line IL1 without the use of a separate connecting line). However, the second data line D2 or the third data line DL3, which is located in a direction toward an edge of the display panel 10 relative to the first data line DL1, is not directly connected to the second input line IL2 or the third input line IL3. Rather, the second data line D2 or the third data line D3 may be connected to the second input line IL2 or the third input line IL3 via the second connecting line CL2 or the third connecting line CL3 extending through the display area DA. Accordingly, the second input line IL2 and the third input line IL3 are not located near the second data line DL2 and the third data line DL3 (e.g., are not located in the same area as the second data line DL2 or the third data line DL3). Rather, the second input line IL2 and the third input line IL3 may relatively be located at the center of the display panel 10. Via this structure, an area of the dead space around the edge of the display area DA may be significantly reduced. For example, in an exemplary embodiment, the second data line D2 and the third data line D3 are respectively connected to the second input line IL2 and the third input line IL3, the second input line IL2 and the third input line IL3 are located near the center of the display panel 10, and the second data line D2 and the third data line D3 are not located near the center of the display panel 10 (e.g., are not located as close to the center of the display panel 10 as compared to the second input line IL2 and the third input line IL3).

According to exemplary embodiments, among a plurality of data lines (e.g., data lines DL1 through DL5) located in the display area DA of the display panel 10, a data line(s) located near the center of the display panel 10 may be directly connected to a corresponding input line(s) located in the peripheral area PA, and another data line(s) located further from the center of the display panel 10 and closer to an edge of the display panel 10 may be connected to a corresponding input line(s) located in the peripheral are PA via a connecting line extending through the display area DA, as described above.

As illustrated in FIGS. 3 and 4, the portion of the third connecting line CL3 extending over the first and second data lines DL1 and DL2 may be more adjacent to the first peripheral area PA1 than the portion of the second connecting line CL2 (the second portion P2 extending over the first data line DL1. Since the portion of the third connecting line CL3 extending over the first and second data lines DL1 and DL2 extends over two data lines, this portion may have a greater length than the second portion P2 of the second connecting line CL2, which extends over only one data line. For example, a length of the portion of the third connecting line CL3 (the portion including the same material as a material included in the pixel electrode 311) may be greater than the length of the second portion P2 of the second connecting line CL2 (the second portion P2 including the same material as a material included in the pixel electrode 311).

However, since the portion of the third connecting line CL3 extending over the first and second data lines DL1 and DL2 is more adjacent to the first peripheral area PA1 than the portion of the second connecting line CL2 (the second portion P2) extending over the first data line DL1, the total length of the third connecting line CL3 and the total length of the second connecting line CL2 may be substantially the same as each other. Based on this structure, in the case of the second data line DL2 and the third data line DL3 using the connecting lines, a length of a path of each of the second data line DL2 and the third data line DL3 from their corresponding input line to their corresponding data line may be substantially the same as each other.

Also, in the case of the first data line DL1, the fourth data line DL4, and the fifth data line DL5, even when it is possible to implement these data lines without connecting lines, as illustrated in FIGS. 3 and 4, connecting lines extending through the display area DA may still be intentionally used to connect the first data line DL1, the fourth data line DL4, and the fifth data line DL5 to the input lines in an exemplary embodiment. Based on this structure, the data lines may be connected to the input lines, respectively, via the connecting lines, and all of the connecting lines may have substantially the same length. However, in this case, the connecting lines connected to the first data line DL1, the fourth data line DL4, and the fifth data line DL5 may extend through a deeper region of the display area DA than the third connecting line CL3 or the second connecting line CL2.

Hereinafter, a display device 310 and devices electrically connected to the display device 310 are described with reference to FIG. 5, and spatial relationships of the data lines DL1 and DL2, and the second connecting line CL2 are described.

As illustrated in FIG. 5, which schematically illustrates a cross-section of a portion of the region taken along line V-V of FIG. 4, in addition to the display device 310, a thin film transistor 210 to which the display device 310 is electrically connected may be located in the display area DA of the substrate 100. FIG. 5 illustrates that the display device 310 is implemented as an organic light-emitting device located in the display area DA. The organic light-emitting device is electrically connected to the thin film transistor 210 by way of the pixel electrode 311 being electrically connected to the thin film transistor 210.

The thin film transistor 210 may include a semiconductor layer 211 including, for example, amorphous silicon, polycrystalline silicon, or an organic semiconductor material, a gate electrode 213, a source electrode 215a, and a drain electrode 215b. The gate electrode 213 may include various conductive materials and have various layer structures. For example, the gate electrode 213 may include a Mo layer and an Al layer. The source electrode 215a and the drain electrode 215b may also include various conductive materials and have various layer structures. For example, the source electrode 215a and the drain electrode 215b may include a Ti layer and an Al layer.

To obtain an insulating property between the semiconductor layer 211 and the gate electrode 213, a first gate insulating layer 121 including an inorganic material such as, for example, silicon oxide, silicon nitride, and/or silicon oxynitride, may be included between the semiconductor layer 211 and the gate electrode 213. In addition, a first interlayer insulating layer 131 including an inorganic material such as, for example, silicon oxide, silicon nitride, and/or silicon oxynitride, may be arranged on the gate electrode 213, and the source electrode 215a and the drain electrode 215b may be arranged on the first interlayer insulating layer 131.

The insulating layer including the inorganic material may be formed by using, for example, chemical vapor deposition (CVD) or atomic layer deposition (ALD). This aspect is the same in exemplary embodiments described below, and in exemplary embodiments modified from the exemplary embodiments described below.

A buffer layer 110 including an inorganic material such as, for example, silicon oxide, silicon nitride, and/or silicon oxynitride, may be arranged between the thin film transistor 210 having the above-described structure and the substrate 100. The buffer layer 110 may increase planarization of an upper surface of the substrate 100, or may prevent or reduce penetration of impurities from the substrate 100 into the semiconductor layer 211 of the thin film transistor 210.

Also, the planarization layer 140 may be arranged on the thin film transistor 210. For example, when, as illustrated in FIG. 5, an organic light-emitting device is arranged on the thin film transistor 210, the planarization layer 140 may substantially planarize an upper portion of a protection layer covering the thin film transistor 210. The planarization layer 140 may include, for example, an organic material such as acryl, benzocyclobutene (BCB), or hexamethyldisiloxame (HMDSO). Although the planarization layer 140 is illustrated as a single layer in FIG. 5, the present disclosure is not limited thereto. For example, in exemplary embodiments, the planarization layer 140 may include multiple layers. Similarly, various other modifications may be made to exemplary embodiments.

The display device 310 may be located on the planarization layer 140 in the display area DA of the substrate 100. The display device 310 may be, for example, an organic light-emitting device including the pixel electrode 311, an opposite electrode 315, and an intermediate layer 313 arranged between the pixel electrode 311 and the opposite electrode 315 and including an emission layer. As illustrated in FIG. 5, the pixel electrode 311 may contact any one of the source electrode 215a and the drain electrode 215b through an opening formed in the planarization layer 140 to be electrically connected to the thin film transistor 210.

A pixel-defining layer 150 may be arranged on the planarization layer 140. The pixel-defining layer 150 may have an opening corresponding to each of sub-pixels, for example, an opening to expose at least a central portion of the pixel electrode 311, thereby defining a pixel. Also, as illustrated in FIG. 5, the pixel-defining layer 150 may increase a distance between an edge of the pixel electrode 311 and the opposite electrode 315 above the pixel electrode 311, thereby preventing the occurrence of, for example, arcs at the edge of the pixel electrode 311. The pixel-defining layer 150 may include, for example, an organic material such as polyimide or HMDSO.

The intermediate layer 313 of the organic light-emitting device may include a low-molecular weight material or a high-molecular weight material. When the intermediate layer 313 includes a low-molecular weight material, the intermediate layer 313 may have a structure including a stack of any one of a hole injection layer (HIL), a hole transport layer (HTL), an emission layer (EML), an electron transport layer (ETL), an electron injection layer (EIL), etc., or a stack of a combination thereof, and the intermediate layer 313 may be formed by using, for example, a vacuum deposition method. When the intermediate layer 313 includes a high-molecular weight material, the intermediate layer 313 may have a structure including an HTL and an EML. Here, the HTL may include poly(3,4-ethylenedioxythiophene) (PEDOT), and the EML may include polyphenylenevinylene-based and polyfluorene-based high-molecular weight materials. The intermediate layer 313 may be formed by using, for example, a screen printing method, an inkjet printing method, a laser-induced thermal imaging method (LITI), etc. However, the intermediate layer 313 is not limited thereto, and may have various structures.

Also, the intermediate layer 313 may include a layer integrally formed as a single body throughout a plurality of pixel electrodes 311, or may include layers patterned to respectively correspond to the plurality of pixel electrodes 311.

The opposite electrode 315 may be arranged in the display area DA and may cover the display area DA. For example, the opposite electrode 315 may be integrally formed as a single body throughout a plurality of organic light-emitting devices, and may correspond to the plurality of pixel electrodes 311. The opposite electrode 315 may cover the display area DA and may extend to the peripheral area PA outside the display area DA.

In an exemplary embodiment, an encapsulation layer may cover the organic light-emitting device to protect the organic light-emitting device from being damaged by, for example, external water or moisture. The encapsulation layer may cover the display area DA and may extend to at least a portion of the peripheral area PA. The encapsulation layer may include, for example, a first inorganic encapsulation layer, an organic encapsulation layer, and a second inorganic encapsulation layer.

The data lines DL1 through DL5 may be located on the same layer (e.g., directly on the same layer) as the source electrode 215a and the drain electrode 215b of the thin film transistor 210. Accordingly, the first through fifth data lines DL1 through DL5 may include the same material as a material included in the source electrode 215a and the drain electrode 215b, and the first through fifth data lines DL1 through DL5 may have the same layer structure as the source electrode 215a and the drain electrode 215b. The pixel electrode 311 may be located on the planarization layer 140, which is an insulating layer covering not only the source electrode 215a and the drain electrode 215b, but also the first through fifth data lines DL1 through DL5. Thus, the pixel electrode 311 may be disposed on the first through fifth data lines DL1 through DL5 (with the planarization layer 140 disposed therebetween). Thus, portions of the connecting lines including the second connecting line CL2 may be located on the planarization layer 140. In the case of the second connecting line CL2, the second portion P2 may be located on the planarization layer 140. The second portion P2 is located in the display area DA, and thus, the opposite electrode 315 covers an upper portion of the second portion P2.

Figure 6:
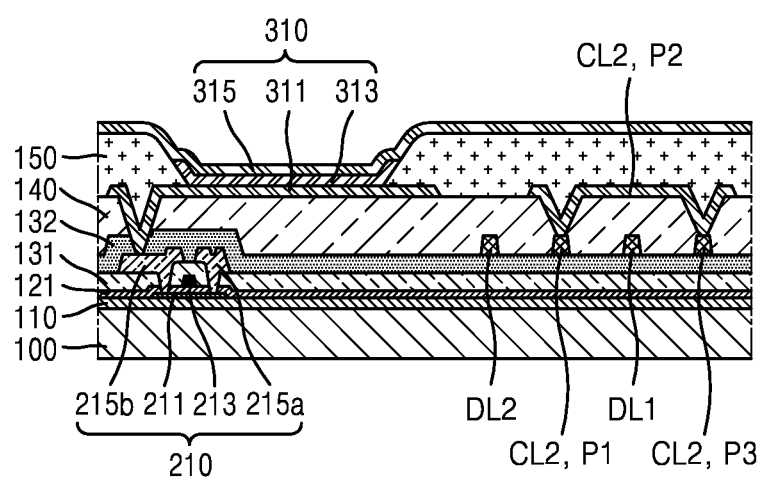
FIG. 6 is a schematic cross-sectional view of a portion of a display apparatus according to an exemplary embodiment.

However, the disclosure is not limited to the configuration described above, and various modifications may be made according to exemplary embodiments. For example, as illustrated in FIG. 6, which is a cross-sectional view schematically illustrating a portion of a display apparatus according to an exemplary embodiment, a second interlayer insulating layer 132 including an inorganic material such as, for example, silicon oxide, silicon nitride, and/or silicon oxynitride, may cover the source electrode 215a and the drain electrode 215b on the first interlayer insulating layer 131, and the first data line DL1 and the second data line DL2 may be located on the second interlayer insulating layer 132. In this case, a power supply line may be located on the same layer (e.g., directly on the same layer) as the source electrode 215a and the drain electrode 215b, or on the same layer (e.g., directly on the same layer) as the first and second data lines DL1 and DL2. Alternatively, in an exemplary embodiment, some of the data lines may be located on the first interlayer insulating layer 131 and the others may be located on the second interlayer insulating layer 132.

Figure 7:
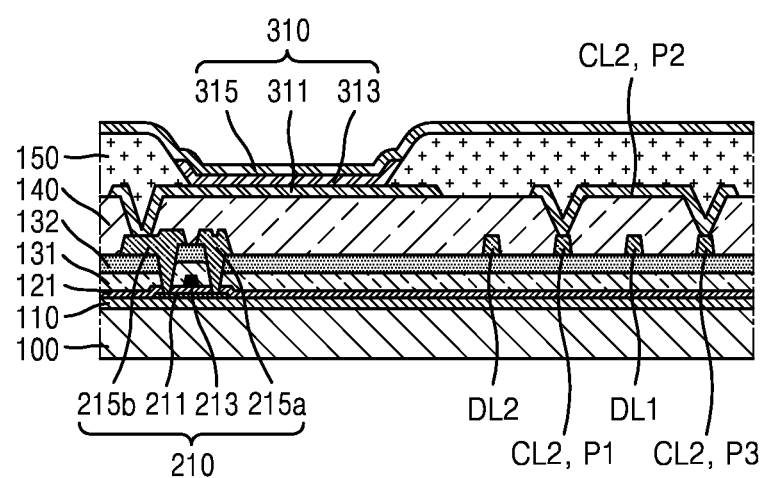
FIG. 7 is a schematic cross-sectional view of a portion of a display apparatus according to an exemplary embodiment.

Unlike an exemplary embodiment according to FIG. 6, in an exemplary embodiment according to FIG. 7, which is a cross-sectional view schematically illustrating a portion of a display apparatus, all of the first and second data lines DL1 and DL2, the first portion P1 and the third portion P3 of the second connecting line CL2, and the source electrode 215a and the drain electrode 215b may be located on the second interlayer insulating layer 132. In this case, a power supply line or an electrode of a capacitor may be located between the first interlayer insulating layer 131 and the second interlayer insulating layer 132.

Figure 8:
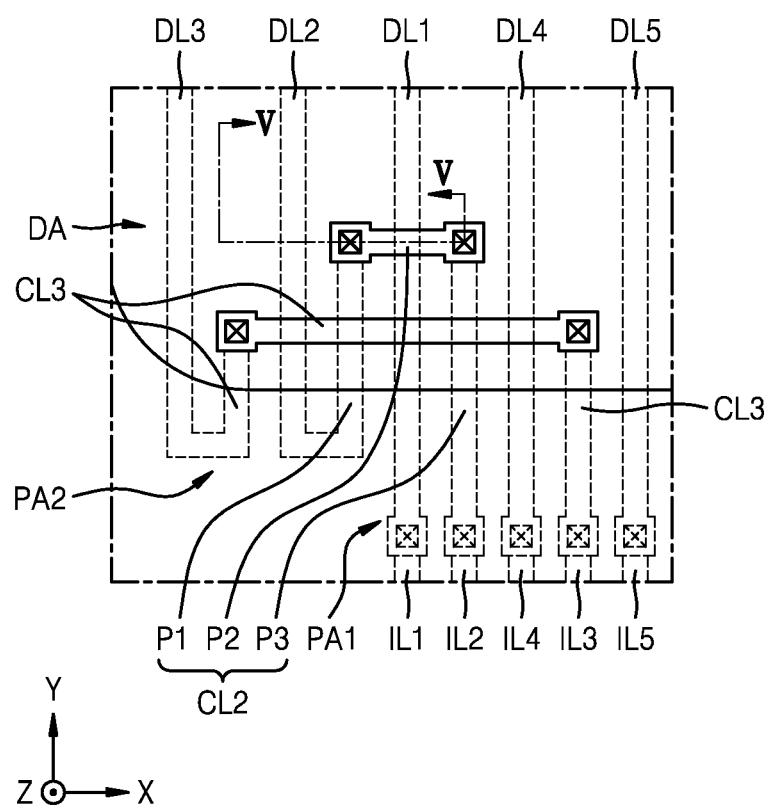
FIG. 8 is a schematic plan view of a portion of a display apparatus according to an exemplary embodiment.

Referring to FIG. 4, in an exemplary embodiment, it is described that the input lines IL1 to IL5 are located on the same layer as the data lines DL1 to DL5. However, the present disclosure is not limited thereto. For example, in an exemplary embodiment as illustrated in FIG. 8, which is a plan view schematically illustrating a portion of a display apparatus, first through fifth input lines IL1 through IL5 may be located below first through fifth data lines DL1 through DL5. For example, the first through fifth input lines IL through 115 may be located on the same layer (e.g., directly on the same layer) as, for example, the gate electrode 213 (see FIG. 5). In this case, the connecting lines may be electrically connected to the corresponding input lines corresponding thereto via a contact hole formed in the first interlayer insulating layer 131.

Figure 9:
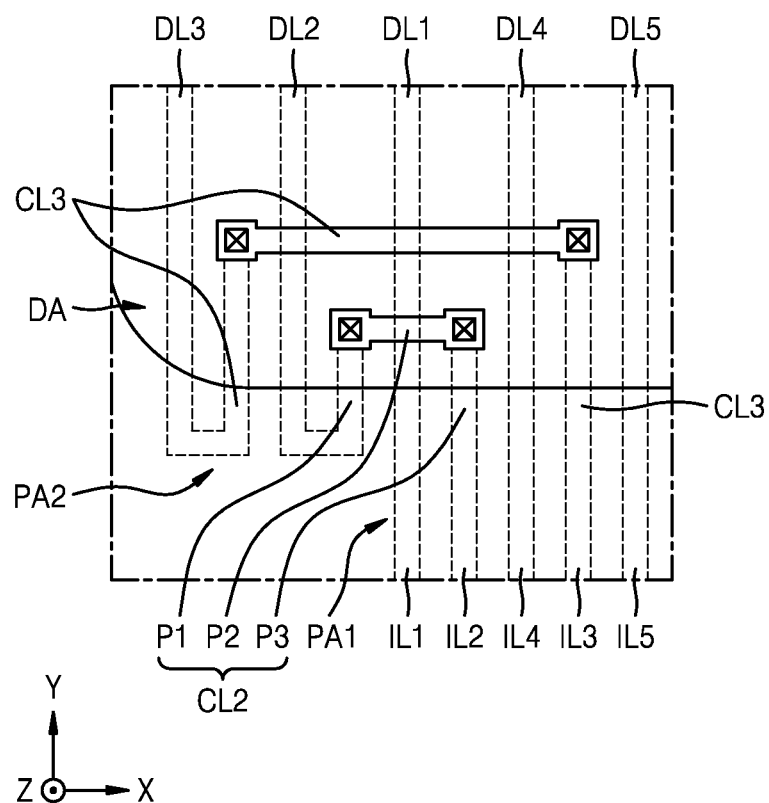
FIG. 9 is a schematic plan view of a portion of a display apparatus according to an exemplary embodiment.

It is described above with reference to FIGS. 3 and 4 that in an exemplary embodiment, the portion of the third connecting line CL3 extending over the first and second data lines DL1 and DL2 may be more adjacent to the first peripheral area PA1 than the portion of the second connecting line CL2 (the second portion P2) extending over the first data line DL1. However, the disclosure is not limited thereto. For example, as illustrated in FIG. 9, which is a plan view schematically illustrating a portion of a display apparatus according to an exemplary embodiment, the portion of the second connecting line CL2 (the second portion P2) extending over the first data line DL1 may be more adjacent to the first peripheral area PA1 than the portion of the third connecting line CL3 extending over the first and second data lines DL1 and DL2.

Figure 10:
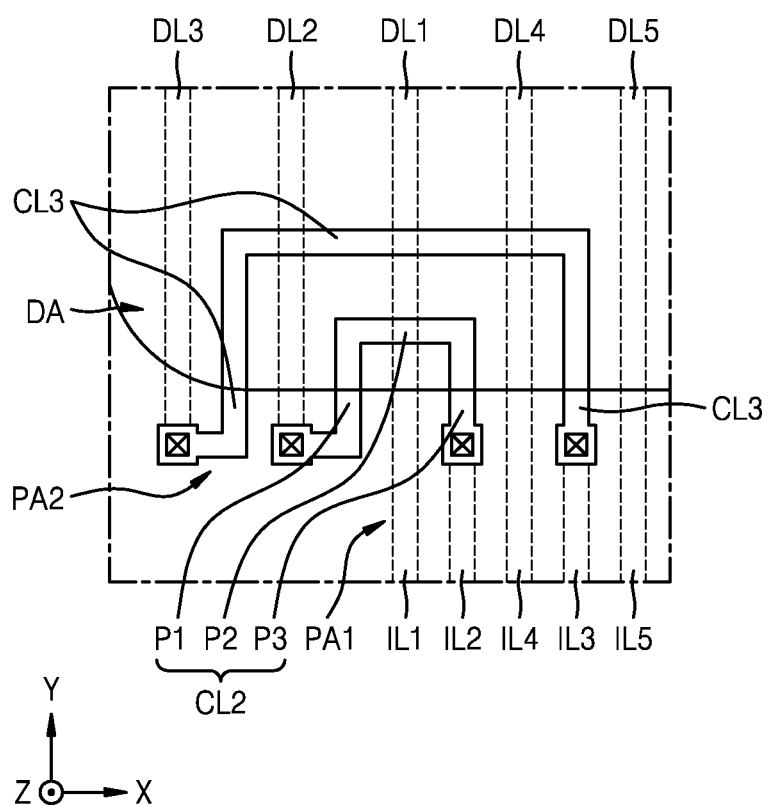
FIG. 10 is a schematic plan view of a portion of a display apparatus according to an exemplary embodiment.
Figure 11:
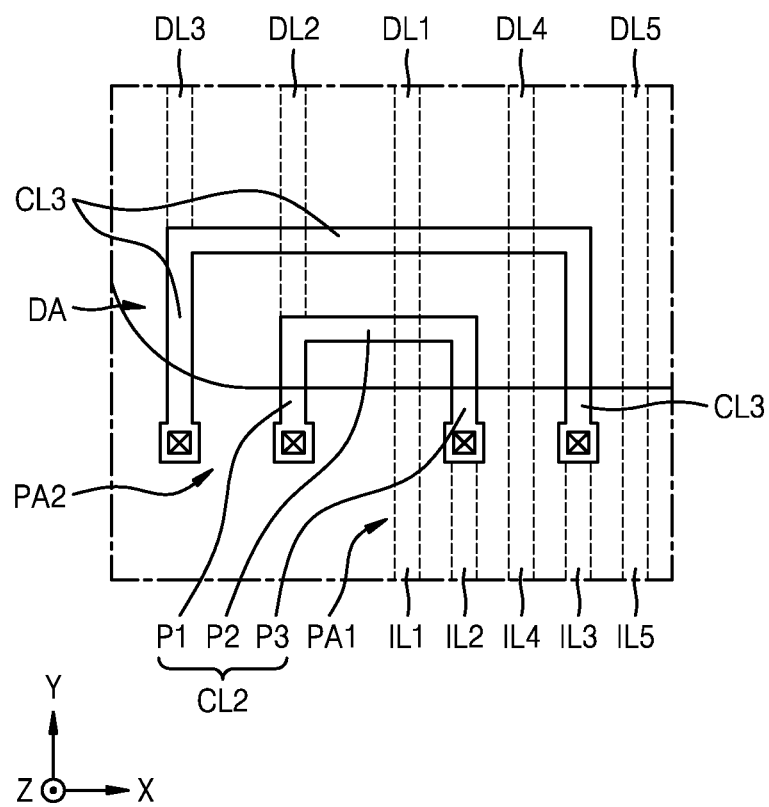
FIG. 11 is a schematic plan view of a portion of a display apparatus according to an exemplary embodiment.

In this case, in an exemplary embodiment, each of the connecting lines does not include a portion located on a different layer from each other, but may be located on the same layer (e.g., directly on the same layer) as each other, as illustrated in FIG. 10. For example, the first through third portions P1 through P3 of the second connecting line CL2 may be integrally formed as a single body and may include the same material as the pixel electrode 311. The third connecting line CL3 may be configured in the same manner. In this case, since each of the connecting lines is located over the data lines, as illustrated in FIG. 11, which is a plan view schematically illustrating a portion of a display apparatus according to an exemplary embodiment, portions of the second and third connecting lines CL2 and CL3 may overlap the second and third data lines DL2 and DL3. For example, the first portion P1 of the second connecting line CL2 may be located on a different layer from the second data line DL2, but may overlap the second data line DL2 in a plan view.

In this manner, in a manufacturing process according to exemplary embodiments, at least a portion of each of the second and third connecting lines CL2 and CL3 may be simultaneously formed with the pixel electrode 311 on the same layer (e.g., directly on the same layer) as the pixel electrode 311. Accordingly, at least a portion of each of the second and third connecting lines CL2 and CL3 may include the same material as the pixel electrode 311 and may have the same layer structure as the pixel electrode 311. The pixel electrode 311 is located on the planarization layer 140 having a relatively large thickness, and thus, the portions of the second and third connecting lines CL2 and CL3 including the same material as the pixel electrode 311 and formed with the pixel electrode 311 are also located on the planarization layer 140 having a relatively large thickness. Thus, a parasitic capacitance occurring between the portions of the second and third connecting lines CL2 and CL3 including the same material as the pixel electrode 311 and formed with the pixel electrode 311, and the first data line DL1 below the planarization layer 140, may be reduced.

Figure 12:
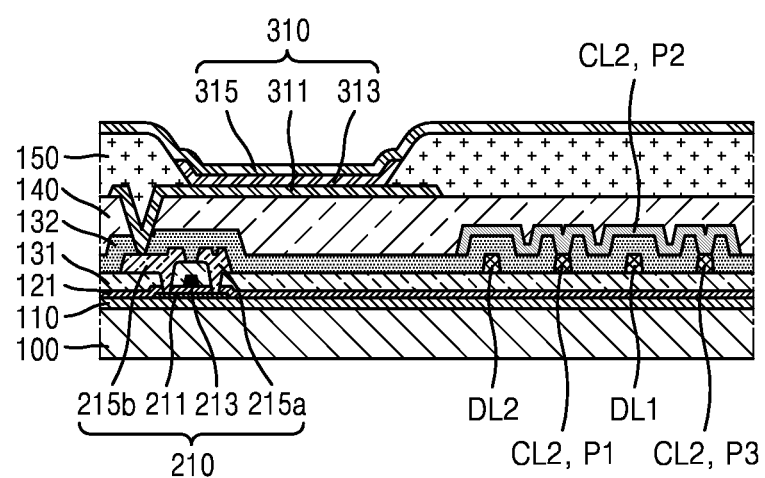
FIG. 12 is a schematic cross-sectional view of a portion of a display apparatus according to an exemplary embodiment.

It is described above that according to exemplary embodiments, at least a portion of each of the second and third connecting lines CL2 and CL3 is formed simultaneously with the pixel electrode 311 on the same layer as the pixel electrode 311. However, the disclosure is not limited thereto. For example, as illustrated in FIG. 12, which is a cross-sectional view schematically illustrating a portion of a display apparatus according to an exemplary embodiment, the first data line DL1 and the second data line DL2 may be located on the first interlayer insulating layer 131 like the source electrode 215a and the drain electrode 215b. Also, the second interlayer insulating layer 132 including an inorganic material such as, for example, silicon oxide, silicon nitride, and/or silicon oxynitride, may cover the source electrode 215a, the drain electrode 215b, the first data line DL1, and the second data line DL2 on the first interlayer insulating layer 131. In this case, a power supply line may be located on the same layer as the source electrode 215a and the drain electrode 215b.

The second connecting line CL2 may include the first portion P1 through the third portion P3 as described above. Here, the first portion P1 and the third portion P3 of the second connecting line CL2 may be located on the first interlayer insulating layer 131, like the source electrode 215a and the drain electrode 215b. Also, the second interlayer insulating layer 132 may cover the first portion P1 and the third portion P3 of the second connecting line CL2. The second portion P2 of the second connecting line CL2 may be located on the second interlayer insulating layer 132, and may be electrically connected to the first portion P1 and the third portion P3 of the second connecting line CL2 through a contact hole. The first portion P1 and the third portion P3 of the second connecting line CL2 may be simultaneously formed with the source electrode 215a and the drain electrode 215b by using the same material as the source electrode 215a and the drain electrode 215b in a manufacturing process. The second portion P2 of the second connecting line CL2 may be formed by using a material that is used when forming the source electrode 215a and the drain electrode 215b. The planarization layer 140 may cover the second portion P2 of the second connecting line CL2.

Figure 13:
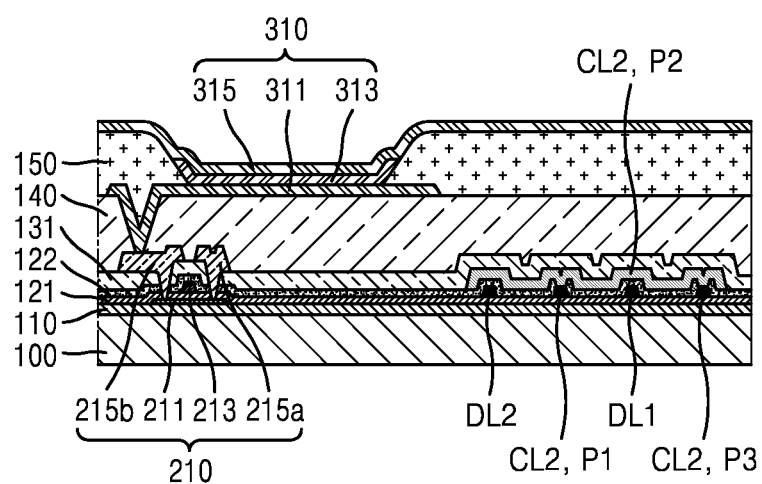
FIG. 13 is a schematic cross-sectional view of a portion of a display apparatus according to an exemplary embodiment.

As illustrated in FIG. 13, which is a cross-sectional view schematically illustrating a portion of a display apparatus according to an exemplary embodiment, in addition to the first interlayer insulating layer 131, a second gate insulating layer 122 may be further arranged between the source electrode 215a and the drain electrode 215b, and the gate electrode 213. For example, the second gate insulating layer 122 may cover the gate electrode 213, and the first interlayer insulating layer 131 may cover the second gate insulating layer 122. The second gate insulating layer 122 may include, for example, silicon oxide, silicon nitride, and/or silicon oxynitride, like the first interlayer insulating layer 131.

The first data line DL1 and the second data line DL2 may be located on the first gate insulating layer 121, like the gate electrode 213. The first data line DL1 and the second data line DL2 may include the same material as the gate electrode 213. For example, the first data line DL1 and the second data line DL2 may be simultaneously formed with the gate electrode 213 by using the same material as the gate electrode 213. The second gate insulating layer 122 may cover the first data line DL1 and the second data line DL2 in addition to the gate electrode 213. In this case, a power supply line may be located on the same layer as the first data line DL1 and the second data line DL2.

The second connecting line CL2 may include the first portion P1 through the third portion P3, as described above. Here, the first portion P1 and the third portion P3 of the second connecting line CL2 may be located on the first gate insulating layer 121, like the gate electrode 213. Also, the second gate insulating layer 122 may cover the first portion P1 and the third portion P3 of the second connecting line CL2. The second portion P2 of the second connecting line CL2 may be located on the second gate insulating layer 122, and may be electrically connected to the first portion P1 and the third portion P3 of the second connecting line CL2 through a contact hole. The first portion P1 and the third portion P3 of the second connecting line CL2 may be simultaneously formed with the gate electrode 213 by using the same material as the gate electrode 213 in a manufacturing process. The second portion P2 of the second connecting line CL2 may be formed by using a material used for forming the gate electrode 213 or by using other conductive materials. The first interlayer insulating layer 131 may cover the second portion P2 of the second connecting line CL2.

According to the exemplary embodiments described above, a display apparatus in which a non-display area may be reduced and which is capable of realizing a high quality image may be provided. However, the scope of the disclosure is not limited thereto.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
    a substrate comprising a display area, a first peripheral area disposed outside the display area, and a second peripheral area disposed outside the display area and the first peripheral area;
    a first data line disposed on the substrate and extending from the first peripheral area into the display area;
    a second data line disposed on the substrate and extending from the second peripheral area into the display area;
    a third data line disposed on the substrate and extending from the second peripheral area into the display area, wherein the second data line is disposed between the first data line and the third data line;
    a pixel electrode;
    a first input line, a second input line, and a third input line disposed in the first peripheral area and spaced apart from one another; and
    a first connecting line having a first end and a second end, wherein the first end is electrically connected to the second data line in the second peripheral area, and the second end is electrically connected to the second input line in the first peripheral area, and
    wherein the first connecting line passes through the display area by extending over the first data line while not contacting the first data line.

2. The display apparatus of claim 1, wherein a portion of the first connecting line is a portion extending over the first data line.

3. The display apparatus of claim 2, wherein the portion of the first connecting line extending over the first data line has a same layer structure as the pixel electrode.

4. The display apparatus of claim 1, wherein at least a portion of the first connecting line and the pixel electrode comprise a same material.

5. The display apparatus of claim 4, wherein the first connecting line comprises:
    a first portion having a first end connected to the second data line in the second peripheral area, wherein the first portion is disposed on a same layer as the second data line and extends to the display area;
    a second portion having a first end connected to a second end of the first portion, wherein the second portion extends over the first data line while not contacting the first data line, and comprises the same material as the pixel electrode; and
    a third portion having a first end connected to a second end of the second portion, wherein a second end of the third portion is electrically connected to the second input line in the first peripheral area.

6. The display apparatus of claim 5, wherein the first end of the second portion is connected to the second end of the first portion through a contact hole formed in an insulating layer disposed between the first portion and the second portion.

7. The display apparatus of claim 6, wherein the contact hole is disposed in the display area.

8. The display apparatus of claim 5, wherein the first portion and the second data line are integrally formed as a single body.

9. The display apparatus of claim 6, wherein the second portion has a same layer structure as the pixel electrode.

10. The display apparatus of claim 5, wherein the third portion is disposed on a same layer as the second input line.

11. The display apparatus of claim 10, wherein the second end of the second portion is disposed over the first end of the third portion and connected to the first end of the third portion through a contact hole formed in an insulating layer disposed between the second portion and the third portion.

12. The display apparatus of claim 11, wherein the contact hole is disposed in the display area.

13. The display apparatus of claim 10, wherein the third portion and the second input line are integrally formed as a single body.

14. The display apparatus of claim 13, wherein the second input line is disposed on a same layer as the second data line.

15. The display apparatus of claim 1, further comprising:
    a second connecting line having a first end and a second end,
    wherein the first end is electrically connected to the third data line in the second peripheral area, and the second end is electrically connected to the third input line in the first peripheral area, and wherein the second connecting line passes through the display area by extending over the first and second data lines while not contacting the first and second data lines.

16. The display apparatus of claim 15, wherein at least a portion of the second connecting line and the pixel electrode comprise the same material.

17. The display apparatus of claim 16, wherein the portion of the second connecting line is a portion extending over the first and second data lines.

18. The display apparatus of claim 17, wherein the portion of the second connecting line extending over the first and second data lines has a same layer structure as the pixel electrode.

19. The display apparatus of claim 17, wherein the portion of the second connecting line extending over the first and second data lines is more adjacent to the first peripheral area than a portion of the first connecting line extending over the first data line.

20. The display apparatus of claim 16, wherein a length of the portion of the second connecting line comprising the same material as the pixel electrode is greater than a length of a portion of the first connecting line comprising the same material as the pixel electrode.

21. The display apparatus of claim 1, further comprising:
a thin film transistor disposed on the substrate in the display area and comprising a source electrode and a drain electrode,
wherein the first through third data lines are disposed on a same layer as the source electrode and the drain electrode.

22. The display apparatus of claim 1, further comprising:
a thin film transistor disposed on the substrate in the display area and comprising a source electrode and a drain electrode,
wherein the first through third data lines are disposed on an insulating layer covering the source electrode and the drain electrode.

23. A display apparatus, comprising:
a first data line extending from a first peripheral area into a display area;
a second data line extending from a second peripheral area into the display area;
a pixel electrode disposed on the first and second data lines;
an input line disposed in the first peripheral area; and
a connecting line having a first end and a second end,
wherein the first end is electrically connected to the second data line in the second peripheral area, and the second end is electrically connected to the input line in the first peripheral area, and
wherein the connecting line passes through the display area by extending over the first data line while not contacting the first data line.

24. The display apparatus of claim 23, wherein at least a portion of the connecting line and the pixel electrode comprise a same material.

* * * * *